(12) United States Patent
Ueyama (10) Patent No.: US 11,276,974 B2
(45) Date of Patent: Mar. 15, 2022

(54) SOCKET FOR ELECTRICAL COMPONENT

(71) Applicant: ENPLAS CORPORATION, Kawaguchi (JP)

(72) Inventor: Yuki Ueyama, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 17/256,102

(22) PCT Filed: Jun. 24, 2019

(86) PCT No.: PCT/JP2019/024954
§ 371 (c)(1),
(2) Date: Dec. 24, 2020

(87) PCT Pub. No.: WO2020/008934
PCT Pub. Date: Jan. 9, 2020

(65) Prior Publication Data
US 2021/0273390 A1    Sep. 2, 2021

(30) Foreign Application Priority Data

Jul. 3, 2018 (JP) .............................. JP2018-127080

(51) Int. Cl.
*H01R 4/48*      (2006.01)
*H01R 33/76*     (2006.01)
(Continued)

(52) U.S. Cl.
CPC ........... *H01R 33/76* (2013.01); *G01R 1/0466* (2013.01); *H01L 23/367* (2013.01); *H01R 12/88* (2013.01); *H01R 13/10* (2013.01); *H05K 7/10* (2013.01)

(58) Field of Classification Search
CPC ............. H01R 13/2442; H01R 13/193; H01R 85/202; H01R 13/41; H01R 23/722
(Continued)

(56) References Cited

U.S. PATENT DOCUMENTS 8,342,872 B2 *  1/2013  Suzuki ............... H01R 13/2435
                                                         439/331
10,274,535 B2 *  4/2019  Ueyama ................. H01R 12/73
(Continued)

FOREIGN PATENT DOCUMENTS

| JP | 51-45516 Y2   | 4/1976  |
| JP | 2003-303658 A | 10/2003 |
| JP | 2016-51644 A  | 4/2016  |

OTHER PUBLICATIONS

International Search Report, PCT/ISA/210, dated Sep. 10, 2019, in corresponding International Patent Application No. PCT/JP2019/024954.
(Continued)

*Primary Examiner* — Phuong Chi Thi Nguyen
(74) *Attorney, Agent, or Firm* — Staas & Halsey LLP (57) ABSTRACT

An IC socket (11) comprises contact pins (14) disposed in the socket body (13) to be disjunctive to terminals of the IC package (12), an opening and closing body (19A,19B) rotatably provided in the socket body (13), the opening and closing body (19A,19B) having a pressing member (23a, 23b) for pressing a top surface of the IC package (12) accommodated on an accommodating surface portion (16d) of the socket body (13); and an operating member (20) for opening and closing the opening and closing body (19A, 19B) disposed up and down movably with respect to the socket body (13). A first opening and closing body (19A) having a heat sink (23a) for pressing an entire of the top surface of the IC package (12) and a second opening and
(Continued)

closing body (19B) having a block (23*b*) for pressing the heat sink (23*a*) are disposed at different positions mutually.

7 Claims, 8 Drawing Sheets

(51) Int. Cl.
    *G01R 1/04*         (2006.01)
    *H01L 23/367*    (2006.01)
    *H01R 12/88*     (2011.01)
    *H01R 13/10*     (2006.01)
    *H05K 7/10*      (2006.01)
(58) Field of Classification Search
    USPC ........................................................ 439/862
    See application file for complete search history.

(56) References Cited

U.S. PATENT DOCUMENTS

| | | | |
|---|---|---|---|
| 10,673,164 B2* | 6/2020 | Horii | H01R 13/41 |
| 2009/0017650 A1* | 1/2009 | Hsieh | H01R 13/2407 |
| | | | 439/82 |

OTHER PUBLICATIONS

Written Opinion of the International Searching Authority, PCT/ISA/237, dated Sep. 10, 2019, in corresponding International Patent Application No. PCT/JP2019/024954.

* cited by examiner

SOCKET FOR ELECTRICAL COMPONENT

CROSS-REFERENCE TO RELATED APPLICATIONS

This application is a U.S. National Stage Application which claims the benefit under 35 U.S.C. § 371 of International Patent Application No. PCT/JP2019/024954 filed on Jun. 24, 2019, which claims foreign priority benefit under 35 U.S.C. § 119 of Japanese Patent Application No. 2018-127080 filed on Jul. 3, 2018, in the Japanese Intellectual Property Office, the contents of all of which are incorporated herein by reference.

TECHNICAL FIELD

This invention relates to a socket for electrical component that removably accommodates an electrical component, such as a semiconductor device (hereinafter referred to as an "IC package").

BACKGROUND ART

Conventionally, this type of "socket for electrical component" is known as an IC socket which removably accommodates an IC package which is an "electrical component".

The IC socket is provided with contact pins in contact with the terminals of the IC package in the socket body, and an opening and closing body is rotatably disposed in the socket body so that the IC package accommodated in the socket body is pressed when the opening and closing body is closed.

The opening and closing body is biased in the closing direction (the direction of pressing the IC package) and is configured to be opened against the biasing force to accommodate and take out the IC package by lowering an operating member which is up and down movably disposed in the socket body.

Then, by pressing the IC package with the opening and closing body, the terminals of the IC package and the contact pins are contacted at a predetermined pressure.

In addition, a heat sink is provided in the opening and closing body, and the heat sink is contacted with the IC package so that heat of the IC package is dissipated.

In an open-top type socket for electrical component, when the opening and closing body of an integral and cantilever type rotatably disposed in the socket body performs an opening and closing motion and is opened and rises up, its height is required above the upper portion of the socket body, so that the open-top type socket for electrical component is difficult to use in an automatic machine.

Accordingly, a number of IC sockets are used in which the opening and closing body is divided into two or four sections, for example, so that when each section of the opening and closing body is opened, the height to rise on the socket body is reduced and the operating space on the socket body is reduced (see, e.g., Patent Document 1 below).

PRIOR ART DOCUMENT

Patent Document

Patent Document 1: Japanese Patent Application Publication No. 2003-303658

SUMMARY OF INVENTION

Problems to be Solved by the Invention

However, in a socket for electrical component in which the opening and closing body that presses the electrical component is divided into a plurality of sections, when the opening and closing body is rotated on the socket body to operate the opening and closing motion, it was necessary to provide clearance between the tips of the opening and closing bodies because the tips of the opening and closing bodies opposite each other interfere with each other.

Accordingly, in the vicinity of the tips of the plurality of the opening and closing bodies, the pressing force on the electrical component tended to be insufficient.

Furthermore, when the heat sink is installed in the opening and closing body, the heat transfer speed decreases or the heat transfer area decreases due to insufficient pressure contact at the position corresponding to the clearance or in the vicinity thereof. Therefore, the heat dissipation effect easily varies.

In particular, as in the case of small IC packages, which have been frequently used in recent years, the clearance between the plurality of the opening and closing bodies tends to cause large variations in the pressing force and heat dissipation effects.

Accordingly, the present invention aims to provide a socket for electrical component which can be pressed uniformly by sufficient pressing force on an entire of the top surface of the electrical component regardless of the position or shape of the electrical component, while using the plurality of the opening and closing bodies to minimize the operating space above the socket body.

Means for Solving Problems

A socket for electrical component comprising: a socket body accommodating an electric component; contact pins disposed in the socket body to be disjunctive to terminals of the electrical component; an opening and closing body rotatably provided in the socket body, the opening and closing body having a pressing member for pressing a top surface of the electrical component accommodated on an accommodating surface portion of the socket body; and an operating member for opening and closing the opening and closing body disposed up and down movably with respect to the socket body;

wherein the opening and closing body includes a first opening and closing body having a first pressing member for pressing an entire of the top surface of the electrical component and a second opening and closing body having a second pressing member for pressing the first pressing member, the first opening and closing body and the second opening and closing body are disposed at different positions mutually.

In the socket for electrical component of the present invention, a closing timing of the first opening and closing body and the closing timing of the second opening and closing body may be different so that the second opening and closing body closes after the first opening and closing body closes.

In the socket for electrical component of the present invention, the first pressing member may be a heat sink.

Further, in the socket for electrical component of the present invention, the first opening and closing body and the second opening and closing body may be openably and closably disposed opposite each other, the first pressing member may be provided with a protruding portion protruded toward to a side of the second pressing member, the second pressing member may be provided with a concave portion for accommodating the protruding portion, and the protruding portion may be provided with a part portion of a pressing surface for pressing the electrical component.

Effect of Invention

According to the socket for electric component of the present invention, since the opening and closing body having a pressing member for pressing a top surface of the electrical component accommodated on an accommodating surface portion is divided into a plurality of sections, the elevation height of the opening and closing body relative to the socket body can be kept low, and the operating space above the socket body can be reduced.

Since the first pressing member for pressing an entire of the top surface of the electrical component provided of the first opening and closing body is pressed by other pressing member of the other opening and closing body, the entire of the top surface of the electrical component can be pressed by not only the pressing force obtained by the first opening and closing body but also by the pressing force obtained by the plurality of opening and closing bodies, even if the opening and closing body is divided into a plurality of sections. Therefore, the entire of the top surface of the electrical component can be pressed uniformly with sufficient pressing force, regardless of the position or shape of the electrical component.

Accordingly, a socket for electrical component can be provided in which the entire of the top surface of the electrical component can be pressed uniformly with sufficient pressing force, regardless of the position or shape of the electrical component, while the operating space above the socket body can be kept small.

In the socket for electrical component of the present invention, if a closing timing of the first opening and closing body and the closing timing of the second opening and closing body are different so that the second opening and closing body closes after the first opening and closing body closes, the first opening and closing body and the second opening and closing body can realize reliable operation without interference during their rotation even if the rotation regions are partially overlapped because the second pressing member of the second opening and closing body presses the first pressing member of the first opening and closing body.

In the socket for electrical component of the present invention, if the first pressing member is a heat sink, the heat sink can contact to the entire of the top surface of the electrical component uniformly with a sufficient pressing force as much as possible, regardless of the position or shape of the electrical component, and the heat transfer speed and heat transfer area can be secured by efficiently dissipating heat.

In the socket for electric component of the present invention, if the first opening and closing body and the second opening and closing body are openably and closably disposed opposite each other, if the first pressing member is provided with a protruding portion and the second pressing member is provided with a recess portion for accommodating the protruding portion, and if the protruding portion is provided with a part portion of a pressing surface for pressing the electrical component, the pressing force of the first pressing member and the pressing force of the second pressing member can be loaded more uniformly even if the electrical component is small, and it is reliably avoided that the clearance inevitably formed between the first opening and closing body and the second opening and closing body is placed on the top surface of the electrical component.

EMBODIMENT FOR CARRYING OUT THE INVENTION

Hereinafter, embodiments of the Present invention will be described in detail with reference to figures.

As shown in FIGS. 1 to 5, the numeral 11 is an IC socket as a "socket for electrical component", and the IC socket 11 is used to electrically connect a plate-like terminal of the IC package 12 to a printed wiring board (not shown) of a measuring instrument (tester) for performing performance tests of the IC package 12 as an "electrical component".

The IC package 12 is a so-called LGA (Land Grid Array), and the terminals are arranged in a matrix on the underside surface of the square package body.

The IC socket 11 has a socket body 13 disposed on a printed wiring board. The socket body 13 includes a base portion 15 in which a number of contact pins 14 are disposed to contact the terminals of the IC package 12, and a floating plate 16 disposed above the base portion 15.

A pair of opening and closing bodies 19A, 19B for pressing the upper surface of the IC package 12 are rotatably mounted on the socket body 13, and an operating member 20 of square frame-shape for opening and closing the opening and closing bodies 19A, 19B is up and down movably arranged on the socket body 13.

The contact pins 14 of the present embodiment are formed of a springy and electrically conductive plate and is press-fitting fixed to the holes of the base portion 15. Leads protruding downwardly from the base portion 15 are electrically connected to the printed wiring board.

A contact portion is formed at the upper end portion of each of the contact pins 14, which is inserted through a through hole in the floating plate 16 in an elastically biased manner, and is electrically connected to the terminals of the IC package 12 from below.

The floating plate 16 is provided with a square-shaped accommodating surface portion 16d for the IC package 12 so as to be able to accommodate the IC package 12 on the accommodating surface portion 16d.

In the present embodiment, the accommodating surface portion 16d is surrounded by a plurality of guide pins 16b in the central portion of the floating plate 16. The upper end portion of each of the guide pins 16b has a tapered shape, and the IC package 12 is precisely positioned and accommodated in the accommodating surface portion 16d by being inserted along the plurality of guide pins.

The floating plate 16 is up and down movably disposed with respect to the base portion 15 and is biased upwardly by a spring 17. The stopper portion 15b extending from the base portion 15 is configured to be guided and stopped at the top dead point position.

Figure 3:
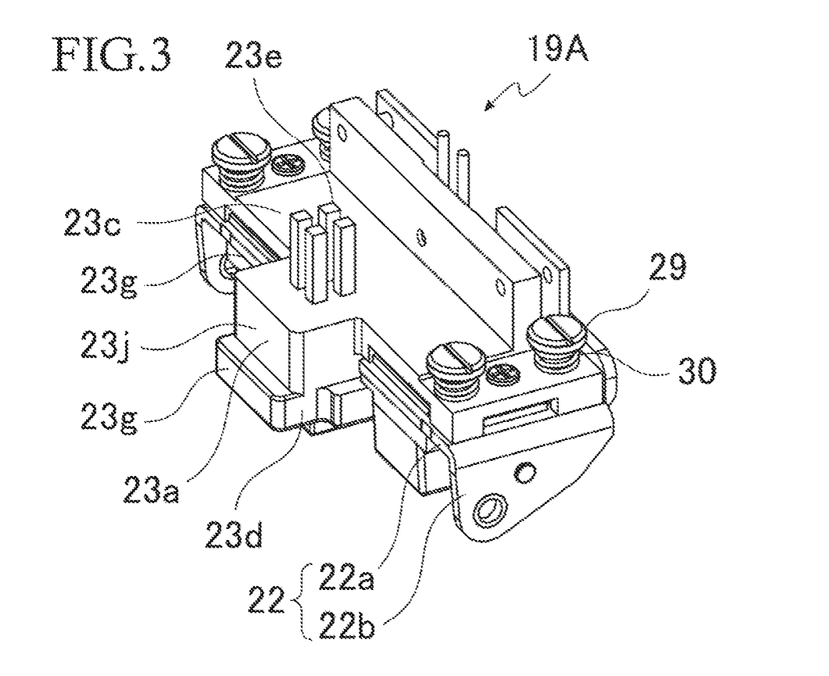
FIG. 3 is a perspective view illustrating the first opening and closing body of the IC socket according to the embodiment of the present invention.
Figure 4:
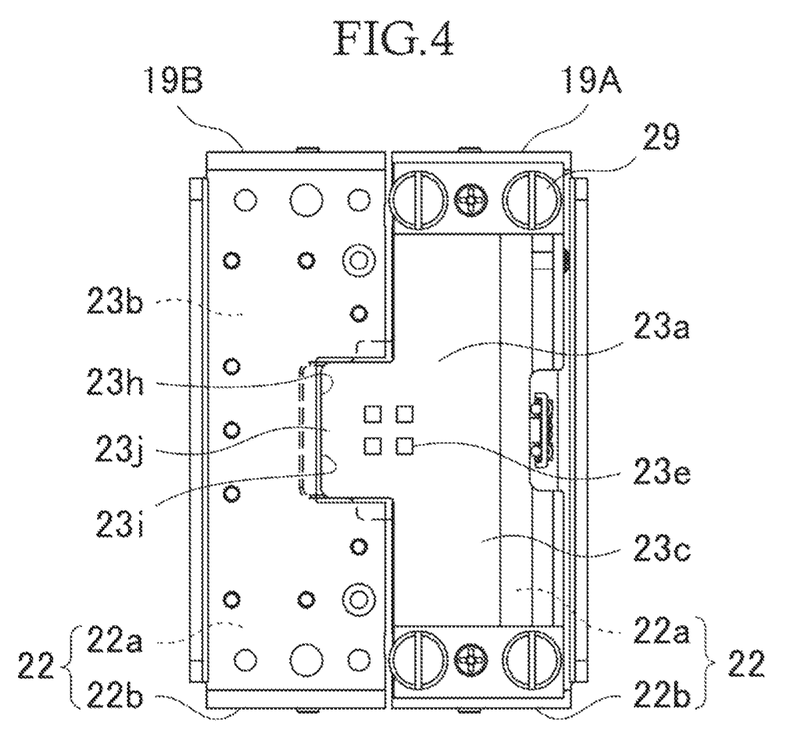
FIG. 4 is a plan view illustrating the IC socket according to the embodiment of the present invention showing the first and second opening and closing body being closed.

As shown in FIGS. 3 and 4, the first opening and closing body 19A and the second opening and closing body 19B are rotatably disposed in the socket body 13 at different positions through the opening and closing mechanism. Here, it is possible to open and close in the opposite direction, so-called double doors is possible.

In this embodiment, the size of the first opening and closing body 19A and the second opening and closing body 19B in planar view is substantially equal.

The first opening and closing body 19A includes a base plate 22 and a heat sink 23a as "first pressing member" attached to the base plate 22.

The second opening and closing body 19B includes a base plate 22 likewise the case of the first opening and closing body 19A and a block 23b as "second pressing member" attached to the underside surface of the base plate 22.

The base plate 22 is formed to be substantially equal size in plan view in the first opening and closing body 19A and the second opening and closing body 19B, and the base plate 22 includes a plane portion 22a having a concaved shape portion concaved from the tip end side in plan view and a vertical piece portion 22b bent to both ends of the plane portion 22a in the width direction to which the opening and closing mechanism is connected.

The heat sink 23a includes a support portion 23c disposed above the plane portion 22a of the base plate 22 when the first opening and closing body 19A is closed, and a convex portion 23d integrally formed with the support portion 23c and protruding below the plane portion 22a near the center of the floating plate 16 when the first opening and closing body 19A is closed.

The support portion 23c of the heat sink 23a is disposed on the top surface of the plane portion 22a of the base plate 22 and is guided by a mounting screw 29 threaded to the plane portion 22a to be displaceable in a vertical direction with respect to the plane portion 22a. The support portion 23c is biased by a coil spring 30 in a direction in which the support portion 23c is abutted against the plane portion 22a.

The support portion 23c is provided with a heat dissipation fin 23e which is protruded and has a suitable shape for efficiently performing heat dissipation.

The convex portion 23d of the heat sink 23a is provided with a pressing surface 23f that presses an entire of the top surface of the IC package 12 at a position facing the accommodating surface portion 16d when the first opening and closing body 19A is closed, and a pressed and locked portion 23g locked and pressed downward by the block 23b of the second opening and closing body 19B.

The block 23b of the second opening and closing body 19B is fixed to the plane portion 22a of the base plate 22 and is configured to enable to press the heat sink 23a downwardly. The block 23b of the second opening and closing body 19B is provided with a pressing locking portion 23h which is in contact with the pressed and locked portion 23g of the heat sink 23a and is capable of pressing downwardly.

Not particularly limited, a protruding portion 23j is formed protruded toward the side of the second opening and closing body 19B at the distal end of the heat sink 23a of the first opening and closing body 19A, and a concave portion 23i is formed in the block 23b of the second opening and closing body 19B concaved from the side of the distal end. When the first opening and closing body 19A and the second opening and closing body 19B are closed, the protruding portions 23j is accommodated in the concave portion 23i. The protruding portion 23j is provided with a part of the convex portion 23d of the heat sink 23 and a part portion of the pressing surface 23f at the lower end of the convex portion 23d.

In this embodiment, the protruding portion 23j of the heat sink 23a is accommodated in the concave portion 23i of the block 23b, so that the convex portion 23d of the heat sink 23a is disposed near the center of the floating plate 16, and the pressing surface 23f provided in the convex portion 23d is disposed at a position facing the accommodating surface portion 16d of the floating plate 16.

Further, the pressing locking portion 23h of the heat sink 23a is protruded into the concave portion 23i of the block 23b, and when the second opening and closing body 19B is closed, the block 23b of the second opening and closing body 19B contacts and presses downward the pressed and locked portion 23g of the convex portion 23d of the heat sink 23a.

Such heat sink 23a may be formed of a material such as a metal having good thermal conductivity, such as, for example, aluminum die casting. The block 23b may also be made of a metal having good thermal conductivity, such as aluminum die casting, as well as the heat sink 23a.

The opening and closing mechanism of the first opening and closing body 19A and the second opening and closing body 19B connects the first opening and closing body 19A and the second opening and closing body 19B to the socket body 13 so that the first opening and closing body 19A and the second opening and closing body 19B are rotatable to be opened and closed, and in this embodiment a link mechanism 27 is provided.

The link mechanism 27 includes a first link member 24 and a second link member 26 each of which is provided as a pair on each side of the base plate 22, and connects a support post 15c of the base portion 15 of the socket body 13, the vertical piece portions 22b of the base plate 22 of the first opening and closing body 19A and the second opening and closing body 19B, and the operating member 20.

The configuration of the link mechanism 27 is not particularly limited. The link mechanism 27 may be anything so long as the link mechanism 27 can make the first opening and closing body 19A and the second opening and closing body 19B open and close by raising and lowering the operating member 20 relative to the socket body 13 so that the IC package 12 can be taken in and out above the accommodating surface portion 16d of the floating plate 16 and also the heat sink 23a can displace from a pressing position for pressing the IC package 12 to a standby position by the link mechanism 27.

In this embodiment, for example, the first link member 24 is rotatably connected to the support post 15c of the base portion 15 of the socket body 13 at one end and is rotatably connected to the vertical piece portion 22b of the base plate 22 of the first opening and closing body 19A and the second opening and closing body 19B at the other end, and the second link member 26 is rotatably connected to the operating member 20 at one end and rotatably connected to the vertical piece portion 22b of the base plate 22 of the first opening and closing body 19A and the second opening and closing body 19B at the other end.

Figure 1:
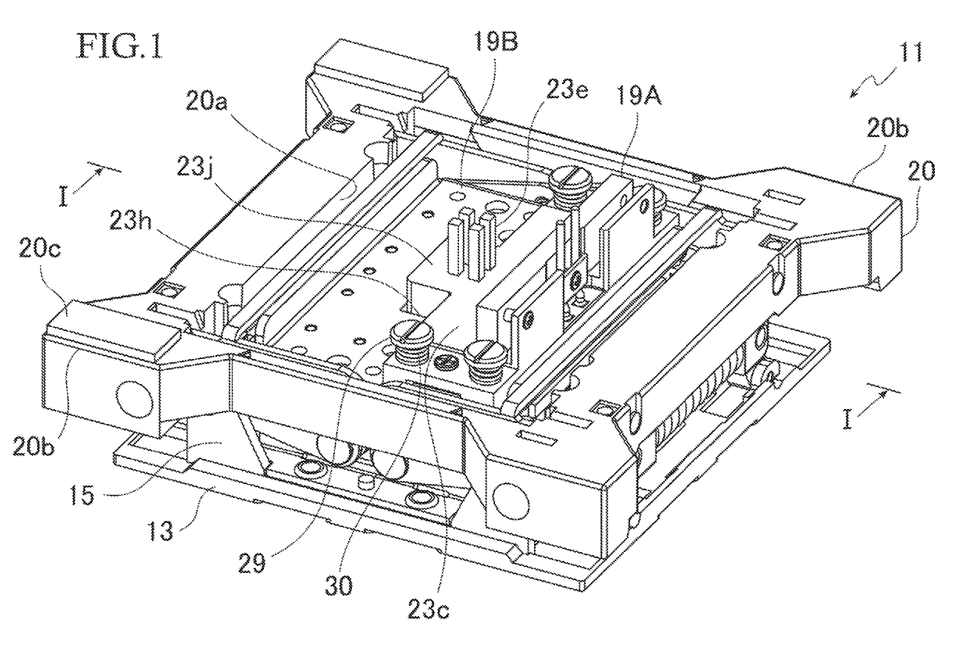
FIG. 1 is a perspective view illustrating an IC socket according to an embodiment of the present invention showing a pair of the opening and closing bodies being closed.
Figure 2:
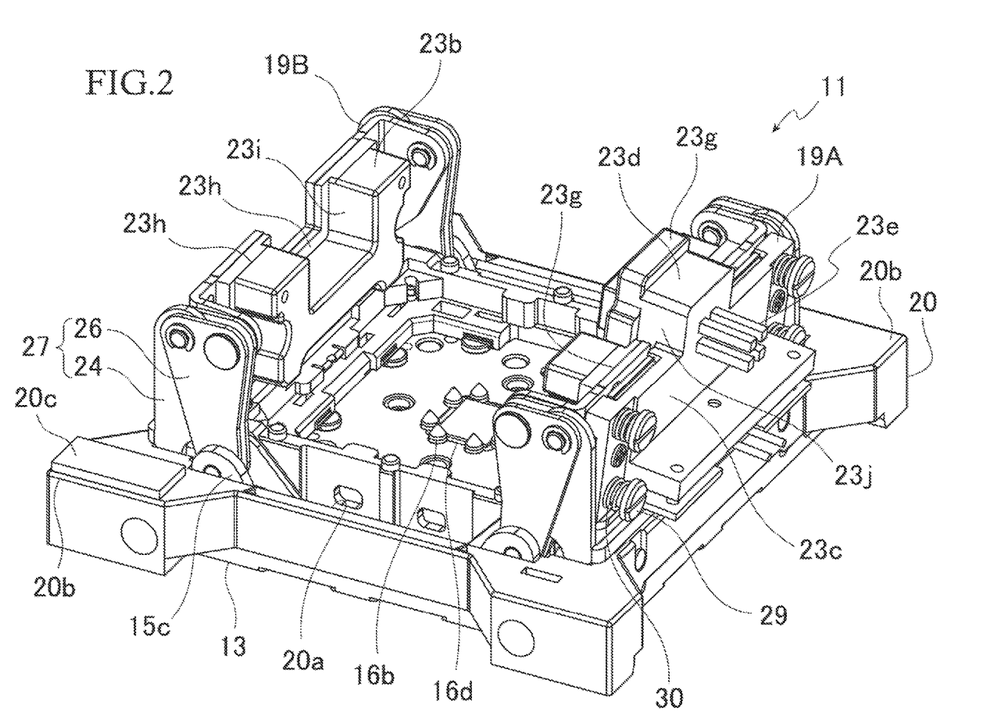
FIG. 2 is a perspective view illustrating the IC socket according to the embodiment of the present invention showing a pair of the opening and closing bodies being opened.

The operating member 20 exhibits a square-shaped frame with an opening 20a of a size in which the IC package 12 can be inserted and is up and down movably arranged relative to the socket body 13. The operating member 20 is biased upward.

The upper surface of the four corners of the operating member 20 is an operation input portion 20b for pressing the operating member 20 from above and lowering the operating member 20.

For example, the operation input portion 20b is pressed downward by a presser (not shown), so that the operating member 20 can be lowered against the biasing force of the operating member 20, and the first opening and closing body 19A and the second opening and closing body 19B can be opened and closed through the link mechanism 27. Here, the opening and closing amount of the first opening and closing body 19A and the second opening and closing body 19B can be realized according to the displacement amount of the operating member 20.

The operation input portion 20b of the operating member 20 is provided with a timing adjustment means for differentiating the closing timing between the first opening and closing body 19A and the second opening and closing body 19B so that the second opening and closing body 19B is closed after the first opening and closing body 19A is closed. In this embodiment, as the timing adjustment means, a spacer 20c is disposed on the upper surface of the two operation input portions 20b disposed on the second opening and closing body 19B side.

If the spacer 20c is provided on the second opening and closing body 19B side, the operating member 20 on the side of the second opening and closing body 19B can be pressed ahead of the first opening and closing body 19A by the thickness of the spacer 20c when the operation input portion 20b in the four corners of the operating member 20 is pressed by a presser or the like of an automatic machine disposed at the same height, and the second opening and closing body 19B can be opened before the first opening and closing body 19A is opened, and the second opening and closing body 19B can be closed after the first opening and closing body 19A is closed.

The IC package 12 can be accommodated in the IC socket 11 as follows.

Figure 6:
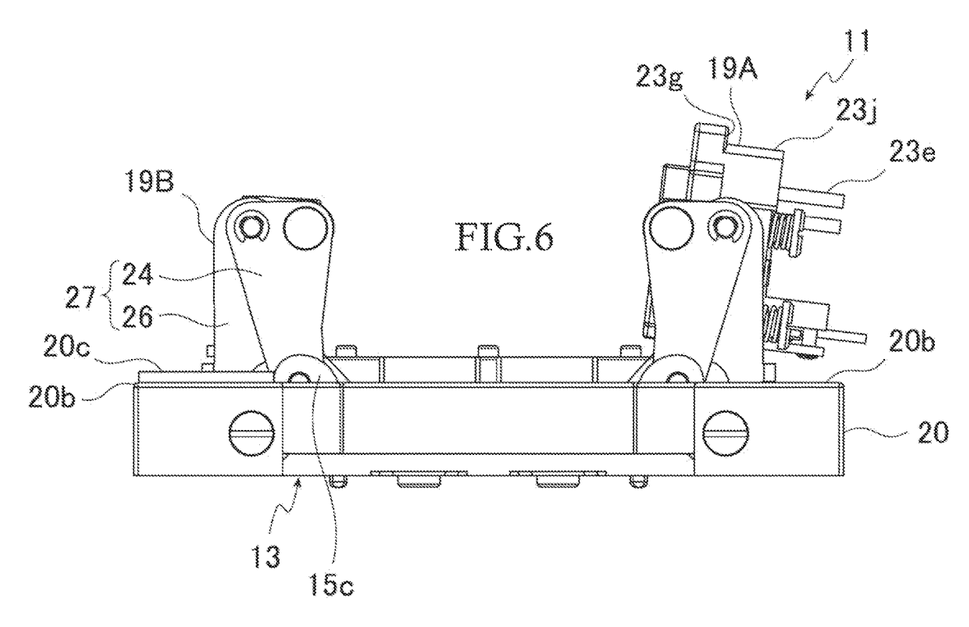
FIG. 6 is a side view illustrating the IC socket according to the embodiment of the present invention showing the first and second opening and closing bodies being fully opened.

First, for example, the operation input portion 20b in the four corners of the operating member 20 is pressed by a presser (not shown) of the automatic machine. As shown in FIG. 6, the operating member 20 is pushed down against the biasing force and displaced to the lowest end position.

As shown in FIG. 2, the first opening and closing body 19A and the second opening and closing body 19B can be opened against the biasing force and are opened to the maximum extent. The first opening and closing body 19A and the second opening and closing body 19B are disposed in a substantially vertical direction and retreated from the range of the accommodating surface portion 16d for accommodating the IC package 12.

In this state, the IC package 12 is guided by guide pins 16b on the floating plate 16 and accurately accommodated on the accommodating surface portion 16d.

Thereafter, by raising the presser (not shown) of the automatic machine, the operating member 20 is restored to an upward position by the biasing force, and the first opening and closing body 19A and the second opening and closing body 19B are moved in the closing direction by the biasing force.

At this time, the amount of closing of the first opening and closing body 19A and the second opening and closing body 19B corresponds to the rising amount of the operating member 20 connected through the link mechanism 27.

Figure 7:
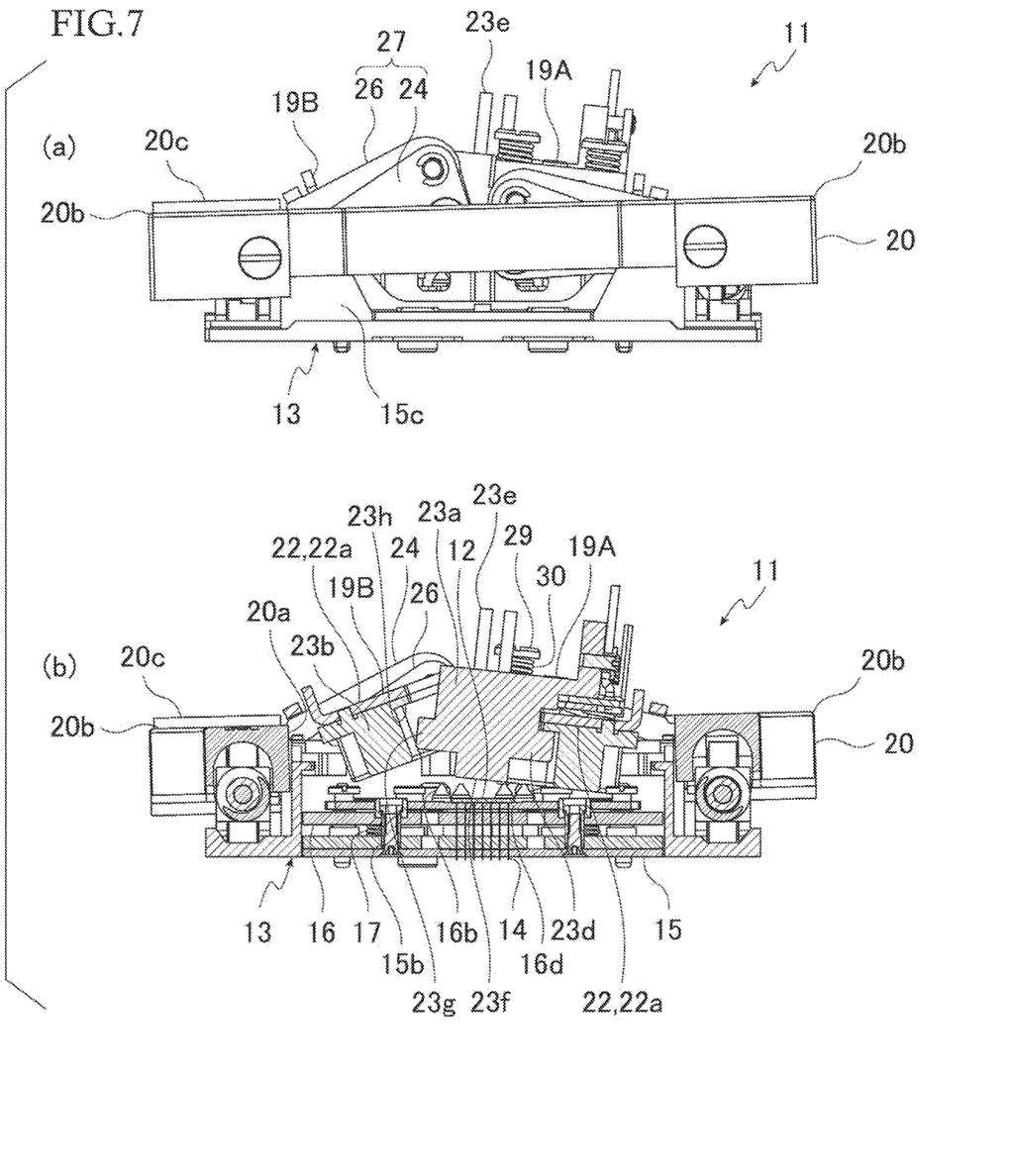
FIG. 7 illustrates the IC socket according to the embodiment of the present invention showing a middle state toward closing from an opened state of the first and second opening and closing bodies, wherein (a) is a side view and (b) is an I-I cross-sectional view of FIG. 1.

Since a spacer 20c is disposed in the operation input portion 20b of the second opening and closing body 19B of the operating member 20, the amount of closing of the first opening and closing body 19A increases ahead of that of the second opening and closing body 19B as shown in FIG. 7(a) (b). Accordingly, the pressed and locked portion 23g of the heat sink 23a of the first and closing body 19A is disposed below the pressing locking portion 23h of the block 23b of the second opening and closing body 19B.

Figure 5:
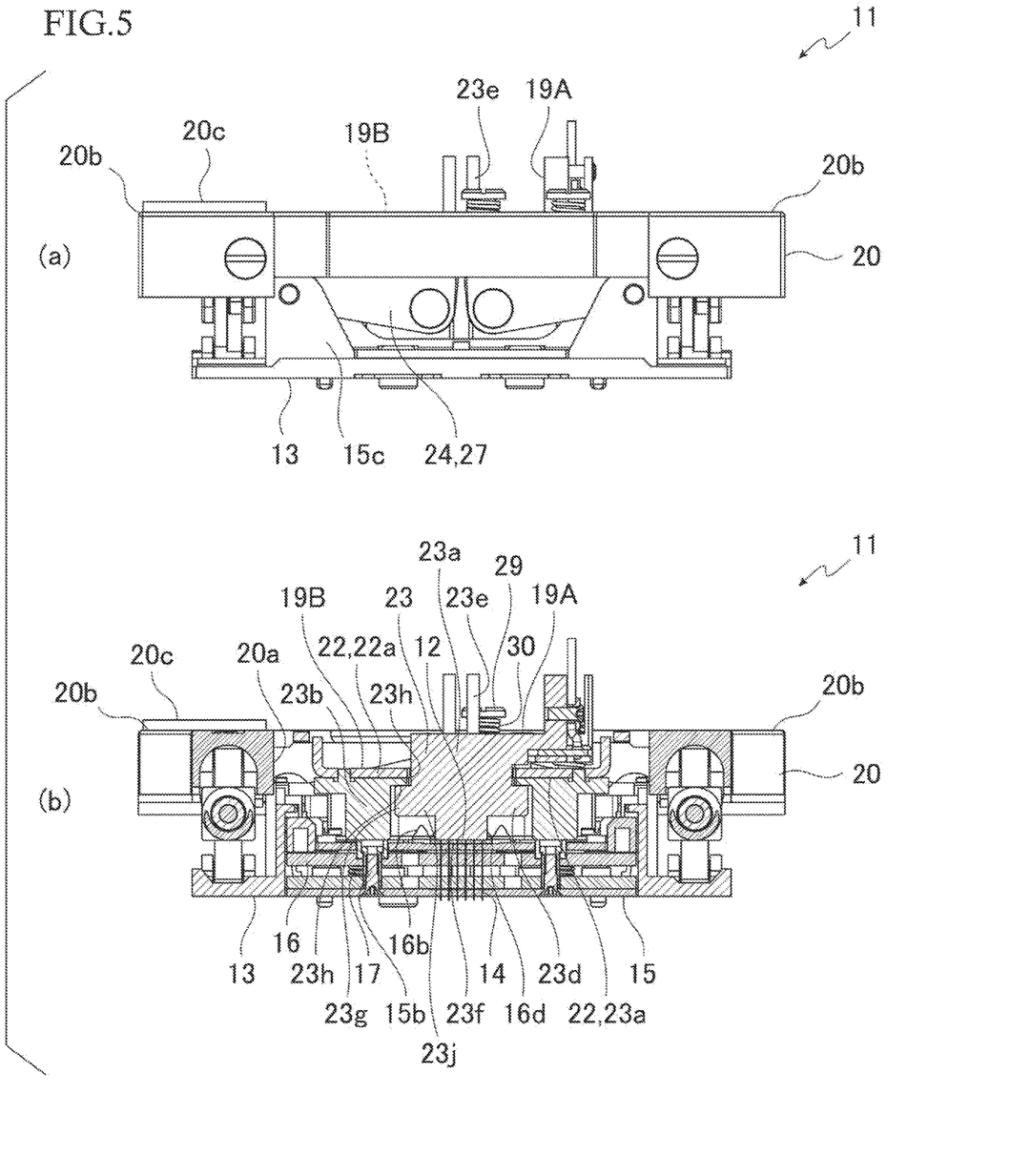
FIG. 5 illustrates the IC socket according to the embodiment of the present invention showing the first and second opening and closing bodies being closed, wherein (a) is a side view and (b) is an I-I cross-sectional view of FIG. 1.

Thereafter, when the operating member 20 is opened by raising the presser (not shown) of the automatic machine, the operation input portion 20b at the four corners of the operating member 20 rises to the same height as shown in FIG. 5(a) (b), and the first opening and closing body 19A and the second opening and closing body 19B are completely closed.

Accordingly, the IC package 12 can be pressed to the accommodating surface portion 16d by the pressing surface 23f while the heat sink 23 is pressed by the block 23b of the second opening and closing body 19B.

In this case, since the heat sink 23a is disposed in a vertically movable manner with relative to the base plate 22 and the support portion 23c is biased against the plane portion 22a of the base plate 22, a fine angular adjustment can be made when the package body of the IC package 12 is pressed on the pressing surface 23f of the heat sink 23a, so that the pressing surface 23f of the convex portion 23d can have a reliable correspondence with the surface of the IC package 12 and can be pressed in a balanced manner.

According to the IC socket 11 described above, a plurality of opening and closing bodies having a pressing member for pressing the top surface of the IC package 12 on the accommodating surface portion 16d of the socket body 13 are provided, so that the elevation height of each of the opening and closing bodies 19A and 19B relative to the socket body 13 can be kept low, and the operating space above the socket body 13 can be reduced.

Since the heat sink 23a of the first opening and closing body 19A that presses the entire of the top surface of the IC package 12 is pressed by the block 23b of the second opening and closing body 19B, even if the opening and closing bodies 19A and 19B are divided into the plurality of sections, the entire of the top surface of the IC package 12 can be pressed not only by the pressing force obtained by the first opening and closing body 19A but also by the pressing force obtained by the plurality of opening and closing bodies 19A and 19B. Therefore, regardless of the position or shape of the IC package 12, the entire of the top surface of the IC package 12 can be pressed with sufficient pressing force as uniformly as possible.

Accordingly, in the IC socket 11 of this embodiment, the entire of the top surface of the IC package 12 can be uniformly pressed with sufficient pressing force, regardless of the position or shape of the IC package 12, while the operating space above the socket body 13 can be kept small.

In the IC socket 11 of this embodiment, a closing timing of the first opening and closing body 19A and the closing timing of the second opening and closing body 19B are different so that the second opening and closing body 19B is closed after the first opening and closing body 19A is closed. Therefore, the first opening and closing body 19A and the second opening and closing body 19B can realize reliable operation without interference during their rotation even if the rotation regions are partially overlapped because the second pressing member of the second opening and closing body 19B presses the first pressing member of the first opening and closing body 19A.

Furthermore, in the IC socket 11 of this embodiment, since the heat sink 23a is mounted as the first pressing member, the heat sink 23a can be contacted with the entire of the top surface of the IC package 12 as uniformly as possible with sufficient pressing force, regardless of the position or shape of the IC package 12, and the heat transfer speed and heat transfer area can be secured by efficiently dissipating heat.

In the IC socket 11 of this embodiment, the heat sink 23a of the first opening and closing body 19A is provided with the protruding portion 23j and the part portion of the protruding portion 23j is protruded toward to the side of the second opening and closing body 19B, and the second opening and closing body 19B is provided with the concave portion 23j for accommodating the part portion of the protruding portion 23j and the part portion of the pressing surface 23f of the protruding portion 23j is accommodated in the concave portion 23j.

Accordingly, even if a small IC package 12 is used, it is possible to uniformly load the pressing force by the heat sink 23a and the pressing force by the block 23b, and it is reliably avoided that the clearance inevitably formed between the first opening and closing body 19A and the second opening and closing body 19B is placed on the top surface of the IC package 12.

It should be noted that the above-described embodiment may be modified adequately within the scope of the present invention.

For example, in the above-described embodiment, the present invention is applied to the IC socket 11 as a "socket for electrical component", but it is of course applicable to other devices as well. In addition, in the above-described embodiment, the present invention is applied to an IC socket accommodating an LGA type as an "electrical component", but if the electrical component is pressed by an opening and closing body, the present invention can be applied to an IC socket accommodating an IC package such as a BGA (Ball Grid Array) or PGA (Pin Grid Array).

In the above-described embodiment, the first and second opening and closing bodies 19A and 19B are provided as opening and closing bodies mounted to the socket body. However, the number of opening and closing bodies is not particularly limited and may be three or more opening and closing bodies. Even in that case, the first opening and closing body may be better to be pressed by other plurality of opening and closing bodies.

In the above-described embodiment, the spacer 20c, as a timing adjustment means for adjusting the closing timing of the first opening and closing body 19A and the second opening and closing body 19B so that the second opening and closing body 19B is closed after the first opening and closing body 19A is closed, is disposed on the upper surface of the operation input portion 20b on the side of the second opening and closing body, but the timing adjustment means is not particularly limited. For example, the operation input portion 20b of the flat operating member 20 may be pressed with a pusher having different amount of projections from each other. Further, means for differentiating the closing timing having various configurations may be provided at various positions of the first and opening and closing bodies.

Modification

Figure 8:
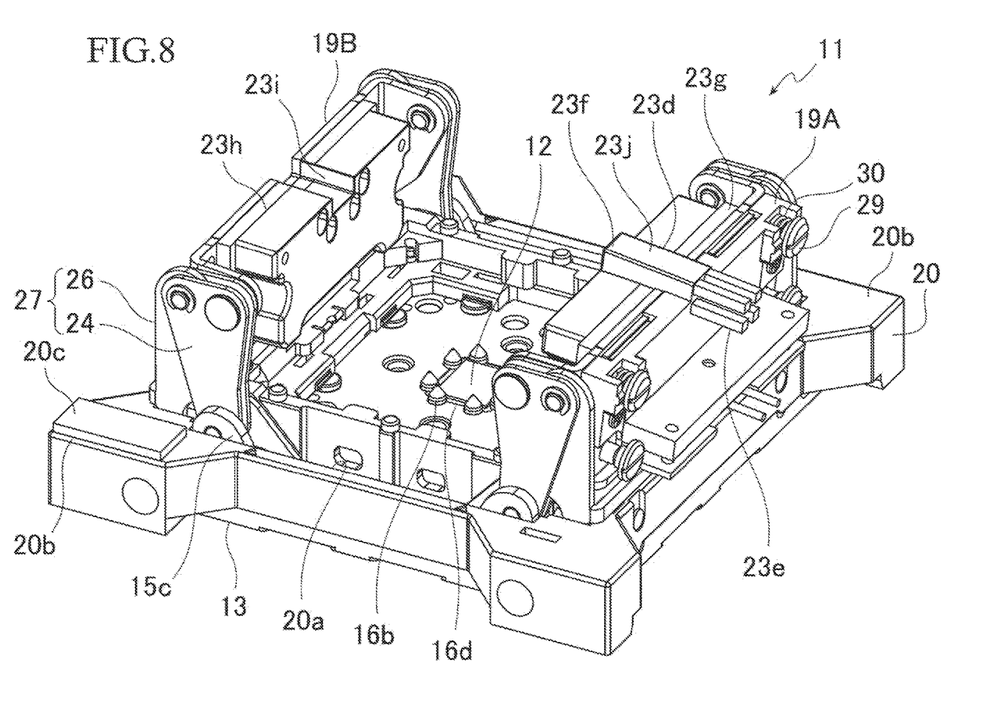
FIG. 8 is a perspective view illustrating an IC socket according to a modification of the embodiment of the present invention, showing a pair of the first and second opening and closing bodies being opened.

FIG. 8 is a perspective view illustrating the IC socket 11 of a modification.

This embodiment is all the same as the first embodiment except that the shape of the heat sink 23a of the first opening and closing body 19A and the block 23b of the second opening and closing body 19B.

In the heat sink 23a of this modification, the convex portion 23d is formed in a straight shape corresponding to the pressing surface 23f.

Further, in the block 23b of the second opening and closing body 19B, the concave portion 23i is formed in the size to accommodate the straight-shaped convex portion 23d, and accommodating holes of guide pins 16b around the accommodating surface portion 16d are provided in the floating plate 16.

Furthermore, the pressing locking portion 23h is not provided in the convex portion 23d of the heat sink 23a and the concave portion 23i of the block 23b, and the pressing locking portion 23h and the pressed and locked portion 23g are provided in other portion other than the pressing locking portion 23h and the pressed and locked portion 23g of the heat sink 23a and the block 23b.

Otherwise, the configuration is the same as that of the above-described embodiment. Even the IC socket 11 of such a modification may have the same effect as the above-described embodiment.

EXPLANATION OF REFERENCE

11 IC socket (socket for electrical component)
12 IC package (electrical component)
13 socket body
14 contact pin
15 base portion
15b stopper portion
15c support post
16 floating plate
16b guide pin
16d accommodating surface portion
17 spring
19A first opening and closing body
19B second opening and closing body
20 operating member
20a opening
20b operation input portion
20c spacer
22 base plate
22a plane portion
22b vertical piece portion
23a heat sink (the first pressing member)

23*b* block (second pressing member)
23*c* support portion
23*d* convex portion
23*f* pressing surface
23*g* pressed and locked portion
23*h* pressing locking portion
23*i* concave portion
24 first link member
26 second link member
26*a* side plate portion
26*b* connecting bridge portion
27 link mechanism

The invention claimed is:

1. A socket for electrical component comprising:
a socket body accommodating an electric component;
contact pins disposed in the socket body to be disjunctive to terminals of the electrical component;
an opening and closing body rotatably provided in the socket body, the opening and closing body having a pressing member for pressing a top surface of the electrical component accommodated on an accommodating surface portion of the socket body; and
an operating member for opening and closing the opening and closing body disposed up and down movably with respect to the socket body,
wherein the opening and closing body includes
a first opening and closing body having a first pressing member for pressing an entire of the top surface of the electrical component, and
a second opening and closing body having a second pressing member for pressing the first pressing member,
the first opening and closing body and the second opening and closing body are being disposed at different positions mutually.

2. The socket for electrical component according to claim 1, wherein the first opening and closing body and the second opening and closing body are openably and closably disposed opposite each other, the first pressing member is provided with a protruding portion protruded toward to a side of the second pressing member, the second pressing member is provided with a concave portion for accommodating the protruding portion, and the protruding portion is provided with a part portion of a pressing surface for pressing the electrical component.

3. The socket for electrical component according to claim 1, wherein the first pressing member is a heat sink.

4. The socket for electrical component according to claim 3, wherein the first opening and closing body and the second opening and closing body are openably and closably disposed opposite each other, the first pressing member is provided with a protruding portion protruded toward to a side of the second pressing member, the second pressing member is provided with a concave portion for accommodating the protruding portion, and the protruding portion is provided with a part portion of a pressing surface for pressing the electrical component.

5. The socket for electrical component according to claim 1, wherein a closing timing of the first opening and closing body and the closing timing of the second opening and closing body are different so that the second opening and closing body closes after the first opening and closing body closes.

6. The socket for electrical component according to claim 5, wherein the first pressing member is a heat sink.

7. The socket for electrical component according to claim 5, wherein the first opening and closing body and the second opening and closing body are openably and closably disposed opposite each other, the first pressing member is provided with a protruding portion protruded toward to a side of the second pressing member, the second pressing member is provided with a concave portion for accommodating the protruding portion, and the protruding portion is provided with a part portion of a pressing surface for pressing the electrical component.

* * * * *

UNITED STATES PATENT AND TRADEMARK OFFICE
CERTIFICATE OF CORRECTION

PATENT NO. : 11,276,974 B2
APPLICATION NO. : 17/256102
DATED : March 15, 2022
INVENTOR(S) : Yuki Ueyama It is certified that error appears in the above-identified patent and that said Letters Patent is hereby corrected as shown below:

In the Claims

Column 11, Line 34 In Claim 1 after "body" delete "are".

Signed and Sealed this
Twenty-fourth Day of May, 2022

*Katherine Kelly Vidal*
Katherine Kelly Vidal
*Director of the United States Patent and Trademark Office*